United States Patent [19]

Fawkes

[11] Patent Number: 4,503,396
[45] Date of Patent: Mar. 5, 1985

[54] CIRCUIT AND METHOD FOR GENERATING A RAMP SIGNAL

[75] Inventor: John S. Fawkes, San Jose, Calif.

[73] Assignee: Ampex Corporation, Redwood City, Calif.

[21] Appl. No.: 364,691

[22] Filed: Apr. 2, 1982

[51] Int. Cl.³ .................. G06G 7/18; H03K 5/00; H03K 4/08
[52] U.S. Cl. .................. 328/127; 307/228; 307/263; 328/114; 328/181; 328/185
[58] Field of Search .............. 328/114, 127, 128, 181, 328/185, 183; 307/263, 228

[56] References Cited

U.S. PATENT DOCUMENTS

| | | | |
|---|---|---|---|
| 3,676,697 | 7/1972 | Davenport | 328/128 |
| 3,783,392 | 1/1974 | Drake et al. | 328/128 |
| 3,878,484 | 4/1975 | Hekimian | 328/127 |
| 4,422,044 | 12/1983 | Mueller | 328/185 |

Primary Examiner—Stanley D. Miller
Assistant Examiner—B. P. Davis
Attorney, Agent, or Firm—Elizabeth Strnad; Joel D. Talcott

[57] ABSTRACT

Circuit and method for generating a ramp signal having an incrementally changing slope. The invention is particularly useful for ramping magnetic recording bias or erase signals by providing a relatively slow slope within the non-linear region of the magnetic medium characteristic while providing a relatively steep slope in the linear region to reduce recording of disturbing "pop" signals.

16 Claims, 5 Drawing Figures

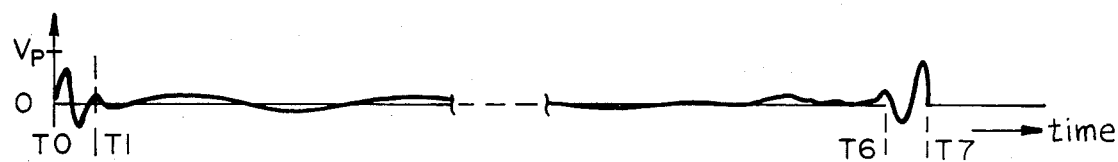
FIG_1 (PRIOR ART)
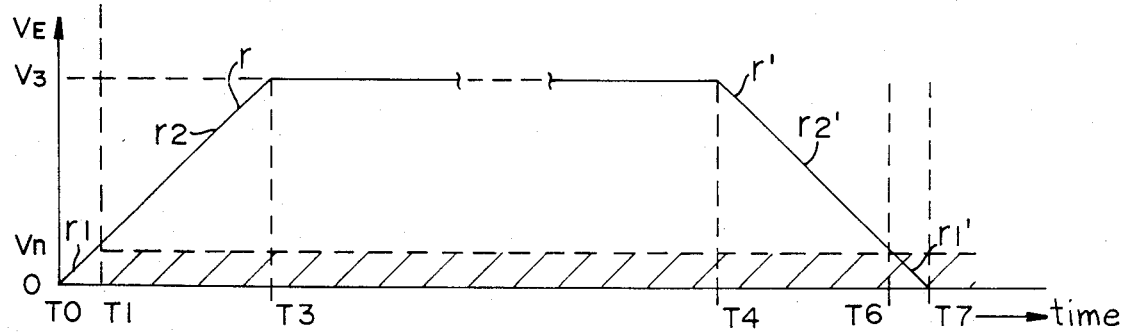
FIG_2 (PRIOR ART)
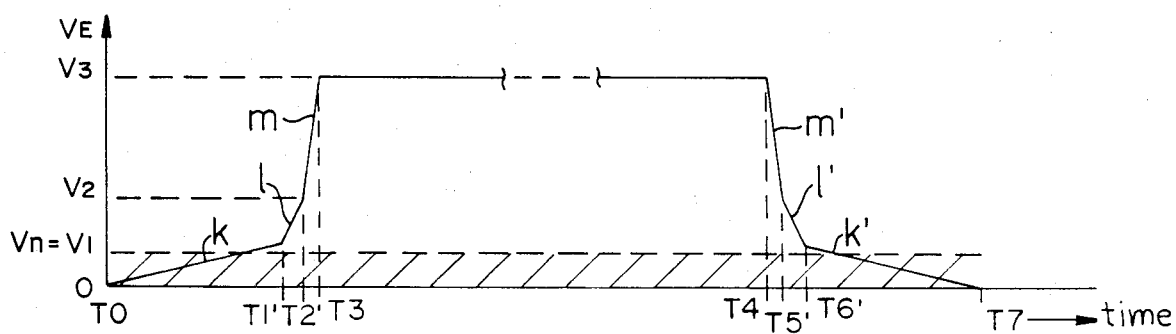
FIG_3
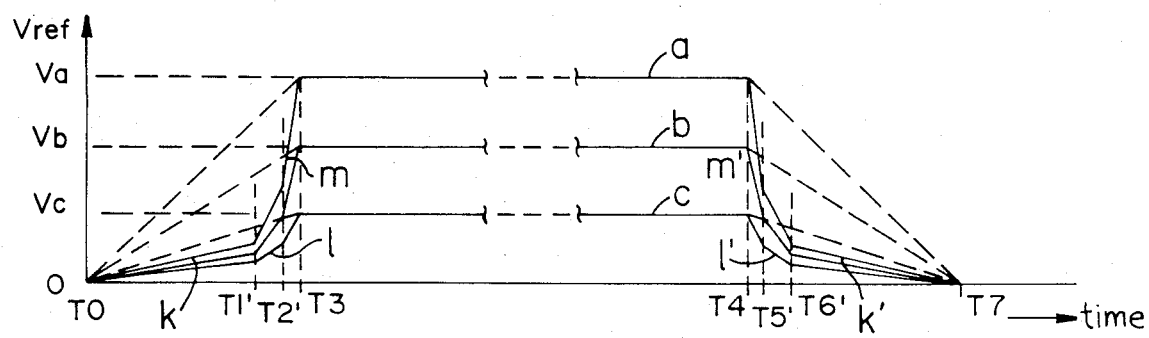
FIG_5

CIRCUIT AND METHOD FOR GENERATING A RAMP SIGNAL

Cross reference is hereby made to a related patent application Ser. No. 364,735, filed concurrently on Apr. 2, 1982 with this application, now U.S. Pat. No. 4,438,466, issued on Mar. 20, 1984, entitled "D.C. Controlled Adjustable Ramp Signal Generator and Method" by John S. Fawkes, et al., and commonly assigned to the assignee of this application.

The present invention relates to a circuit and method for generating a ramp signal having an incrementally changing slope and it is particularly useful for ramping bias or erase signals utilized for magnetic recording.

BACKGROUND OF THE INVENTION

Prior art circuits and methods for generating ramp signals such as useful in magnetic bias signal recording or erase are known to provide linear ramps having a predetermined slope.

In audio magnetic recording it is necessary to provide a "ramp-up" as well as a "ramp-down" signal of a certain duration or length to avoid a disturbing "pop" recorded on the magnetic medium as it is well known in the art. However, in some applications, for example when recording audio signals in video tape recorders, it is also required to obtain an optimum erase or bias signal level within a relatively short time corresponding to one video field or frame interval, that is, within 30 milliseconds or less to facilitate editing. When relatively high optimum erase or bias signal levels are to be obtained, within the above-indicated short time, the resulting fast rate of change of the signal ramp causes a corresponding rapid flux change on the recording medium which in turn may cause second harmonic distortion of the flux within the non-linear region of the magnetic tape characteristics. The steeper is the slope of the ramp within the non-linear region the faster is the flux change and consequently the larger is the magnitude of the recorded disturbing "pop" signal. Therefore, in the latter applications it is desirable to provide a bias or erase signal ramp as long as possible but still within the above-indicated short interval.

An example of a video tape recorder utilizing such prior art audio bias recording and erase circuit is type VPR-2, manufactured by Ampex Corporation, assignor of this patent application. Its bias and erase signal generator circuit is described in VPR-2 Video Production Recorder, Catalog No. 1809384-02, Page 10-7, issued in May 1980. Briefly, that prior art circuit (not shown) has an integrating operational amplifier for providing a desired linearly ramped output voltage in response to an input voltage step. A voltage limiter connected to the integrator limits the output voltage therefrom to a value determined by a master bias level commonly applied as a D.C. reference voltage to all the recording channels. The limited ramped output signal from the integrator is then chopped by a solid state switch at a desired bias or erase signal frequency, and thereafter filtered to obtain a ramped high frequency sine wave signal. The thusly obtained signal is then attenuated by a potentiometer attenuator connected in the high frequency signal path in each respective channel to obtain respective desired optimum levels and thereafter the resulting attenuated signal is applied to a respective bias or erase current amplifier of that particular channel as it is well known in the art.

To illustrate the above-described disadvantages of the prior art circuits, FIG. 1 shows an example of a playback voltage characteristic Vp corresponding to flux remaining on tape after an erase signal has been applied thereto by a prior art audio recording circuit utilized in a video tape recorder. When such a prior art linear ramp signal of a very short duration passes through the non-linear region of the tape it non-symmetrically modulates the high frequency signal recorded thereon and "bumps" such as shown in FIG. 1 are recorded on the tape which, when played back, cause audible "pops" disturbing to the ear. These bumps remain recorded even after a new information signal is recorded on the tape over these bumps, for example during edits. Consequently, following each edit, an audible "pop" remains on the tape.

FIG. 2 shows an example of a prior art erase voltage envelope Ve which may cause the "bumps" such as indicated in the playback characteristic of FIG. 1. The characteristic Ve comprises a linear "ramp-up" portion r, followed by a constant optimum voltage envelope portion V3 and a linear "ramp-down" portion r' as it is known in the art. For example the portion V3 of erase envelope is obtained within 16 milliseconds and typically the "ramp-up" portion r of the signal envelope will pass through the non-linear portion of the magnetic tape characteristics during the first 2 milliseconds, as shown by portion r1 between T0 and T1 in FIG. 2. The non-linear region of the tape characteristic is illustrated in FIG. 2 by a hatched area. The remaining portion r2 of the linearly increasing ramp signal r subsequently passes through the linear portion of the tape characteristic and reaches value V3 at time T3. While the above-described disadvantage of the prior art circuits may be more apparent with respect to erase signal ramps because of the relatively large magnitudes of flux involved, it is also relevant to A.C. bias signal ramps, depending on the optimum signal envelope magnitude and associated time interval in which that magnitude is to be obtained by the linear ramp signal. The duration of the bumps shown in FIG. 1 generally corresponds to the time interval T0 to T1 or T6 to T7 during which the increasing or decreasing tape flux reaches the upper limit of the non-linear region of the tape characteristic as shown at Vn in FIG. 2 or decreases to zero therefrom, respectively. As it is known, the longer the duration of the ramp signal within that non-linear region the larger will be the wavelength of the "bumps" and if a sufficiently long wavelength could be provided it may fall below the audible bandwidth or below the operating range of an associated playback amplifier. However, as mentioned earlier, such a desired long ramp cannot be provided by the prior art circuits when it is also required to obtain an optimum bias or erase signal envelope level within one field or frame interval in video recording applications.

SUMMARY OF THE INVENTION

Accordingly, it is an object of the invention to provide a circuit and method of generating a ramp signal which has a sufficient duration or length within the non-linear region of the magnetic medium characteristics while an optimum signal value is obtained by that ramp signal within a predetermined short time.

It is a further object of this invention to provide a circuit and method for generating an incrementally changing ramp of a recording bias or erase signal having a relatively gentle slope within a non-linear region of the magnetic medium characterstics and which ramp signal has a relatively steep slope outside that region.

BRIEF DESCRIPTION OF THE DRAWINGS

FIG. 1 is an example of a prior art playback voltage characteristic showing "bumps".

FIG. 2 is an example of a prior art erase or bias voltage envelope characteristic related to the playback characteristic of FIG. 1.

FIG. 3 is an example of a ramp signal characteristic in accordance with the present invention.

FIG. 5 shows respective ramp signal characteristics having different optimum D.C. levels as provided by the preferred embodiment of FIG. 4.

DETAILED DESCRIPTION

Figure 4:
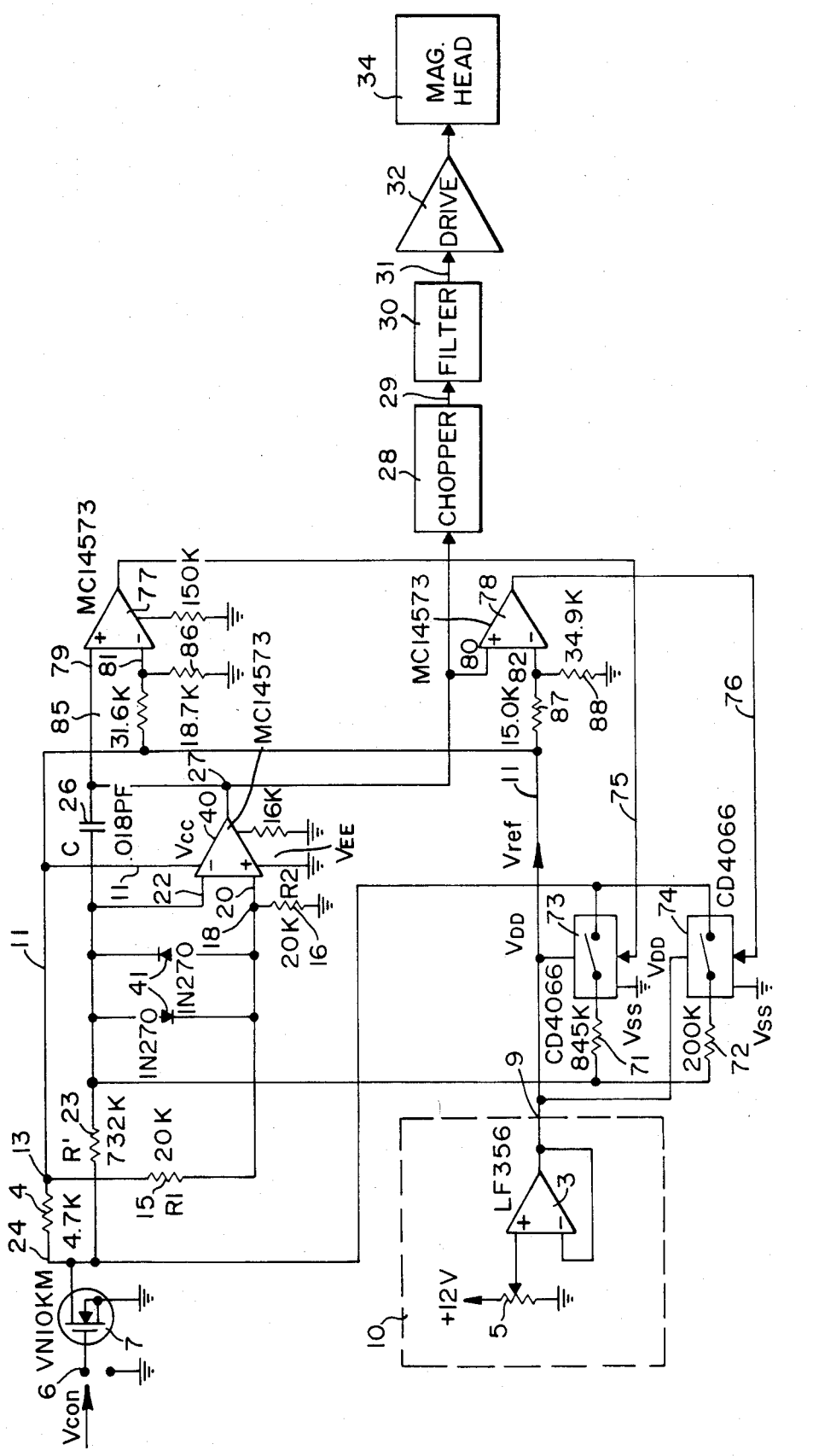
FIG. 4 shows the preferred embodiment of a circuit for generating a ramp signal in accordance with the present invention.

FIG. 3 shows an example of an erase or bias signal ramp generated by the circuit of the preferred embodiment shown in FIG. 4. As it is seen from FIG. 3, the ramp-up signal portion of the characteristic is formed of linear sections or increments k, l and m, each having a different slope with respect to the horizontal axis. Specifically, section k has the most gentle slope, as it may be necessary to eliminate recording of the above-described "bumps". It is followed by section l having a steeper slope while the slope of the last section m is the steepest. As an example, in the preferred embodiment the time interval from the beginning of a ramp-up signal at T0 to T3 when a desired optimum voltage level V3 is obtained, is 16 milliseconds, while the time between T0 and T1 corresponding to the duration of section k is 12 milliseconds. When comparing the characteristics of FIGS. 2 and 3 it is seen that section k of the characteristic of FIG. 3 corresponds to section r1 of FIG. 2, since both occur within the non-linear portion of the magnetic tape characteristic, as described previously with respect to FIG. 2. It is further seen that the duration of portion k of the characteristic of FIG. 3 is substantially longer than that of the previously described portion r1 of the characteristic of FIG. 2.

On the other hand the remaining sections l and m of the characteristic of FIG. 3 have relatively shorter durations, respectively, such as approximately 2 milliseconds each. The latter intervals together provide a time necessary for the ramp characteristic of FIG. 3 to increase past the non-linear region of the tape at T1' until the optimum value V3 is obtained at time T3.

The incrementally sloping ramp characteristic of FIG. 3 has the advantage of providing a linear slope within the non-linear region of the magnetic medium characteristic having a length necessary to eliminate recording of "bumps", and at the same time of obtaining a desired optimum signal level in a predetermined short time. The thusly extended portion k of the signal ramp results in extending the wavelength of a related "pop" recorded on the medium beyond the audible frequency range thus making that recorded signal less objectionable to a listener.

The circuit of a preferred embodiment of the invention will be described now with reference to FIG. 4. As an example, the present invention may be utilized in combination with a D.C. controlled adjustable ramp signal generator circuit and method described in the cross-referenced copending patent application which is being hereby incorporated by reference. It is noted however that the present invention is not restricted to such use. To facilitate comparison between the present and the cross-referenced patent application, corresponding circuit elements of both applications are designated by like reference numerals. Thus, a D.C. voltage source 10 is provided, for example utilizing a 12 V D.C. power supply and a potentiometer 5 connected thereto and having a voltage follower buffer amplifier 3 connected to the output of potentiometer 5. The output signal at output 9 from the buffer amplifier is applied on line 11 and it serves as a reference voltage Vref, such as it is described in the cross-referenced application and at the same time as a power supply of the other circuits of FIG. 4. The reference voltage on line 11 is applied to a resistive voltage divider 15, 16 whose output 18 is connected to a non-inverting input 20 of an integrating operational amplifier 40, preferably of a CMOS type. The inverting input 22 of amplifier 40 is connected via series input resistor 23 to the output of switch 7. A feedback capacitor 26 is connected between the output 27 and inverting input 22 of amplifier 40. Clamping diodes 41 are respectively connected between the inputs 20, 22 of amplifier 40 to maintain a predetermined voltage difference therebetween, as it is known in the art.

As it is described in detail in the cross-referenced patent application, the integrating amplifier 40 provides at its output 27 a linearly increasing or decreasing ramp signal in response to a positive or negative going step signal received at a terminal 6 connected to a control input or gate of switch 7. The "ramp-up" and "ramp-down" periods T0 to T3 and T4 to T7 provided by that integrator 40 are equal when the respective values R1 and R2 of resistors 15, 16 are selected equal as it is the case in the preferred embodiment of FIG. 4. The voltage Vref on line 11 is applied to Vcc source voltage input of amplifier 40 which voltage sets the limit for a maximum output signal value on line 27 from amplifier 40.

The output 27 of integrator 40 is coupled to an input of a chopper 28 whose output is coupled via line 29 to an input of a filter circuit 30. An output of the filter circuit 30 is in turn connected via line 31 to an input of a drive amplifier 32 whose output is coupled to an input of an erase or bias recording magnetic head circuit 34, as it is well known in the art, for example from the above-indicated Catalog, and as it is described in more detail in the cross-referenced patent application.

A portion of the circuit of FIG. 4 in accordance with the present invention and which portion is not described or shown in the cross-referenced patent application will be described below.

Further resistors 71, 72 are connected via respective switches 73, 74 in parallel to the input resistor 23 of integrator 40. For example, switches 73, 74 may be implemented by solid state switches, type CD 4066. Switches 73, 74 are controlled respectively via lines 75, 76 by output signals from respective differential inverting operational amplifiers 77, 78 utilized as voltage comparators. Each amplifier 77, 78 has a non-inverting input 79, 80 connected to the output 27 of the integrating operational amplifier 40. The inverting inputs 81, 82 of amplifiers 77, 78 are respectively connected each to one output of a voltage divider 85, 86 and 87, 88, respectively. Each voltage divider has one terminal connected to line 11 on which the reference voltage Vref is supplied as described previously, while the opposite terminals are grounded. The respective outputs of voltage comparators 77, 78 are connected via lines 75, 76 each to a control input of a respective switch 73, 74 as described previously.

As it is described in the cross-referenced patent application, the integrating amplifier 40 provides at its output 27 a linearly increasing or decreasing output signal in response to a positive or negative control voltage step Vcon received by input terminal 6 and thus the gate of FET switch 7. Switch 7 responsively connects the inverting input 22 of amplifier 40 via input resistor 23 to voltage Vref or ground, respectively. The time constant RC of the integrator 40 is dependent on the respective values R' of resistor 23 and C of capacitor 26 as well known, as well as on the ratio of the resistance values R1, R2 of the voltage divider 15, 16. As noted previously, in the preferred embodiment the latter values are selected R1=R2. However, as distinct from the circuit of the cross-referenced application, the presently described circuit of FIG. 4 changes the above-indicated time constant in predetermined linear increments by controlling switches 73, 74 at predetermined times T1', T2' when voltage levels V1, V2 are respectively obtained to successively connect in parallel resistors 71, 72 to the series input resistor 23 to obtain an incrementally increasing ramp signal at output 27 of amplifier 40. The thusly obtained increasing ramp signal is represented in FIG. 3 by increments k, l and m. To obtain the incrementally decreasing ramp portion m', l', k' as shown in FIG. 3, the switches 73, 74 are controlled to respectively disconnect successively resistors 71, 72 from resistor 23 when respective predetermined voltage levels V2, V1 or points in time T5', T6' are obtained. To obtain the above-described incrementally increasing or decreasing characteristics, in the preferred embodiment of FIG. 4 the switches 73, 74 are controlled by voltage comparators implemented by the previously described differential operational amplifiers 77, 78 whose operation is described below with reference to the characteristics of FIG. 3. It will be understood that to activate the respective switches 73, 74, either the voltage levels V1, V2 or the respective times T1', T2' and T5', T6' necessary to obtain these voltage levels may be detected, respectively.

The voltage divider 85, 86 has the respective values of its resistors selected such that at output 81 therefrom a predetermined ratio of reference voltage Vref is obtained corresponding to a value greater than that of V1 of FIG. 3. Similarly, the respective resistor values of divider 87, 88 are selected such that the output voltage at 82 corresponds to a value V2 shown in FIG. 3. Consequently, when the increasing voltage ramp at the output 27 of integrator 40 reaches value V1 as indicated at time T1' in FIG. 3, the voltage comparator 77 produces a control signal on line 75 which in turn closes switch 73, in turn connecting resistor 71 in parallel with resistor 23. The latter effects a decreased input resistance value of integrator 40 and thereby it shortens the time constant RC thereof, as it is well known. As a result, the slope of the linear ramp signal obtained at output 27 increases as shown by increment 1 in FIG. 3. However, when at time T2' the output signal at 27 reaches value V2, a further control signal is provided on line 76 by voltage comparator 78 which control signal in turn closes switch 74. As a result a further resistor 72 is connected in parallel with resistors 23, 71 thus further decreasing the input resistance and thereby further shortening the time constant RC of the integrator 40. Consequently a further increased slope of the ramp characteristic at output 27 from integrator 40 is obtained as shown by segment m in FIG. 3. The respective control signals on lines 75, 76 remain until the ramp signal level decreases below values V2, V1, respectively, in turn disconnecting switches 74, 73, respectively.

It is seen from the foregoing description that in accordance with the present invention the slope of the ramp signal provided by the circuit of FIG. 4 is changed in predetermined linear increments. Based on the above description it will be understood that by utilizing the present invention it is possible to obtain a relatively gentle or slow slope and thus a desired extended duration or length of a linear ramp signal segment within a non-linear characteristic region of a magnetic medium, while providing segments following in succession having relatively steeper slopes in the linear characteristic region.

There are particular advantages when utilizing the present invention as shown and described with reference to the preferred embodiment of FIG. 4 as follows. When an adjustable reference voltage source such as shown at 10 in FIG. 4 is utilized, it is possible to change the reference voltage Vref while the duration of the entire ramp signal T0 to T3 or T4 to T7 remains the same. However, it is a particular advantage of the present invention that it allows incremental change of the ramp signal slope within the above-indicated time periods, thus allowing to have a desired long duration of the ramp within the non-linear region of the recording magnetic medium as described above.

FIG. 5 shows examples of ramp characteristics provided by the circuit of FIG. 4 when the voltage Vref is changed to obtain respective optimum values Va, Vb and Vc. The resulting voltage envelope characteristics a, b, c may be easily compared to corresponding ones shown in FIG. 2 of the cross-referenced application in which each ramp extends linearly from zero to the respective optimum value within a time period T1 or T2 corresponding to time periods T0 to T3 or T4 to T7 of FIG. 4. The latter linear portions are respectively shown in FIG. 4 in phantom.

It is a further particular advantage of the preferred embodiment of FIG. 4 that when Vref changes as described above with reference to values Va, Vb, Vc, etc., the respective reference voltages received at inputs 81, 82 of voltage comparators 77, 78 change proportionally therewith, thus proportionally changing the respective slopes of increments k, k', l, l', m, m' as it is shown in FIG. 5.

From the foregoing description it follows that any convenient number of increments such as k to m or m' to k' may be provided by the circuit of the present invention by detecting a corresponding number of predetermined ramp signal magnitudes provided by the integrator and by utilizing a corresponding number of parallel resistors such as 71, 72 and switches such as 73, 74, respectively.

Alternatively, instead of detecting the respective voltage levels such as V1, V2, etc., of the ramp signal provided by the integrator 40 utilizing voltage detectors, it may be possible to detect corresponding points in time T'1, T'2, T'5, T'6, etc. at which the above-indicated voltage levels are obtained. For example, the latter detection may be provided by utilizing a device such as a digital counter receiving a clock signal at a known frequency, for detecting a time corresponding to T0, at which the ramp-up signal starts. The counter then would count-up to a predetermined count corresponding to time T'1, and then to T'2, etc. At each obtained count the counter may provide a control signal such as corresponding to those on lines 75, 76 of FIG. 4 to control the switches 73, 74. Alternatively, a microprocessor-controlled detection system may be provided to control the respective switches 73, 74.

It will be readily understood from the foregoing disclosure that while there are significant advantages when utilizing the present invention as a combination of circuit elements shown in the preferred embodiment of FIG. 4, the present invention is not restricted thereto. For example, to obtain an incrementally increasing or decreasing ramp signal by the circuit of the present invention it is not necessary for the voltage source 10 to be adjustable. It is seen that the circuit of FIG. 4 may be utilized in a particular application to obtain a ramp signal such as shown in FIG. 3 for just one selected value of Vref, for example value Ve in FIG. 3 which then represents a fixed Vref utilized for that particular application. In this latter case the output signal obtained at output 27 of integrator 40 may be adjusted to a desired level prior to being applied to chopper 28 shown in FIG. 4.

If in some applications it is desired to provide different ramp-up and ramp-down periods such as T0 to T3 and T4 to T7 shown in FIG. 3 by the circuit of the present invention, the respective values R1, R2 of resistors 15, 16 may be selected as being different, for example having a ratio 1:2, 2:3, etc.

While the invention has been shown and described with particular reference to preferred and alternative embodiments thereof, it will be understood that variations and modifications in form and details may be made therein without departing from the spirit and scope of the invention as defined in the appended claims.

What is claimed is:

1. A circuit for generating a ramp signal, comprising:
a source for providing a first D.C. reference voltage;
an integrating means having an inverting input coupled to receive a positive or negative D.C. input step voltage for responsively coupling said inverting input to said D.C. reference voltage or ground, respectively, having a non-inverting input coupled to receive a predetermined ratio of said D.C. reference voltage and having an output coupled to provide said ramp signal in response to said D.C. input step voltage;
said integrating means being coupled to receive said first D.C. reference voltage and to limit a maximum value of said ramp signal provided thereby to a value determined by said D.C. reference voltage;
said integrating means having a series input resistor coupled between an input terminal for receiving said input step voltage and said inverting input and having a feedback capacitor coupled between said output and said inverting input of said integrating means and having a predetermined number of further input resistors and switch means respectively, each further input resistor being coupled in parallel to said series input resistor via one said switch means; and
a detecting means coupled to detect in succession predetermined magnitudes of said ramp signal and to apply respective control signals in response to each said magnitude obtained by said ramp signal to activate said switch means in said succession.

2. The circuit of claim 1 wherein said integrating means has a predetermined time constant determined by respective values of said series input resistor and capacitor and wherein for an increasing ramp signal said switches are controlled in a first succession to incrementally decrease said time constant and for a decreasing ramp signal said switches are controlled in a second succession opposite to said first succession to incrementally increase said time constant.

3. The circuit of claim 2 wherein for said increasing ramp signal said switches are controlled to connect in said first succession said respective further resistors to said series input resistor and for said decreasing ramp signal said switches are controlled to disconnect in said second succession said respective further resistors from said series input resistor.

4. The circuit of claim 3 further comprising a first resistive voltage divider means having one terminal coupled to said output of said first D.C. reference voltage source, having a second, opposite terminal grounded and having an output terminal provided between said first and second terminal, respectively, said output terminal being coupled to said non-inverting input of the integrating means.

5. The circuit of claim 4 wherein respective resistance values between said first and said output terminal and between said second and said output terminal of said resistive voltage divider means are selected equal to obtain a time interval necessary for ramping-up equal to that which is necessary for ramping-down said ramp signal.

6. The circuit of claim 1 wherein said detecting means comprises means for comparing voltage levels obtained by said ramp signal with respective predetermined further D.C. voltage reference values each obtained as a respective predetermined ratio of said first reference voltage.

7. The circuit of claim 6 wherein said detecting means comprises a predetermined number of voltage comparators and voltage divider means, each voltage comparator having a first non-inverting input coupled to said output of said integrating means and a second inverting input coupled to an output of said voltage divider means, respectively, each said voltage divider means having a first terminal coupled to an output of said source for providing said first D.C. reference voltage and having a second, opposite terminal grounded, and wherein an output of each said voltage comparator is coupled to a control input of one said switch means.

8. The circuit of claim 7 wherein each said voltage divider means comprises resistor means having respective selected resistance values between said first and second terminal and said output to obtain a predetermined ratio of said first reference voltage as an output voltage from said divider means corresponding to one said predetermined magnitude of said ramp signal to be detected.

9. The circuit of any of claims 1 to 8 wherein said source for providing said D.C. reference voltage is an adjustable voltage source.

10. A circuit for generating an adjustable ramp signal, comprising:
an adjustable D.C. reference voltage source having an output coupled to provide a desired adjustable first D.C. reference voltage;
a first means having an input coupled to receive said adjustable first D.C. reference voltage and having an output coupled to provide a predetermined ratio thereof;

an integrating means having an inverting input coupled to receive a positive or negative D.C. input step voltage for responsively coupling said inverting input to said adjustable first D.C. reference voltage or ground, respectively, having a non-inverting input coupled to said output of said first means for receiving said predetermined ratio of said adjustable first D.C. reference voltage and having an output coupled to provide said ramp signal in response to said D.C. input step voltage;

said integrating means being further coupled to receive said adjustable first D.C. reference voltage and to limit a maximum value of said ramp signal provided thereby to a value determined by said adjustable first D.C. reference voltage;

said integrating means having a series input resistor coupled between an input terminal for receiving said input step voltage and said inverting input and having a feedback capacitor coupled between said output and said inverting input of said integrating means and having a predetermined number of further input resistors and switch means respectively, each further input resistor being coupled in parallel to said series input resistor via one said switch means; and a means coupled to detect in succession predetermined magnitudes of said ramp signal and to apply respective control signals in response to each said magnitude obtained by said ramp signal to activate said switch means in said succession.

11. The circuit of claim 10 wherein said first means comprises a resistive voltage divider means having one terminal coupled to said output of said adjustable D.C. reference voltage source, having a second, opposite terminal grounded and having a third terminal provided between said first and second terminal, respectively, corresponding to said output of said first means and wherein a resistance value between said first and third terminal and between said second and third terminal of said resistive voltage divider means is selected equal to obtain a time interval necessary for ramping-up equal to that which is necessary for ramping-down said ramp signal with respect to said maximum value.

12. A circuit for generating an adjustable ramp signal, comprising;
an adjustable D.C. reference voltage source having an output coupled to provide a desired adjustable D.C. reference voltage value;
a first resistive voltage divider means having a first terminal coupled to said output of said adjustable D.C. reference voltage source having a second, opposite terminal grounded, and having a third, output terminal provided between said first and second terminal, respectively;
an integrating means having an inverting input coupled to receive a postive or negative D.C. input step voltage for responsibly coupling said inverting input to said adjustable first D.C. reference voltage or ground, respectively, having a non-inverting input coupled to said output terminal of said voltage divider means for receiving a predetermined ratio of said adjustable first D.C. reference voltage value and having an output coupled to provide said ramp signal in response to said D.C. input step voltage;
said integrating means being further coupled to receive said adjustable first D.C. reference voltage and to limit a maximum value of said ramp signal provided thereby to a value determined by said adjustable first D.C. reference voltage;

said integrating means having a series input resistor coupled between an input terminal for receiving said input step voltage and said inverting input and a feedback capacitor coupled between said output and said inverting input of said integrating means and having a predetermined number of further input resistors and switch means respectively, each further input resistor being coupled in parallel to said series input resistor via one said switch means; and saod corciot further comprising:

a predetermined number of voltage comparators coupled to detect in succession predetermined magnitudes of said ramp signal and voltage divider means, each voltage comparator having a first non-inverting input coupled to said output of said integrating means and a second inverting input coupled to an output of said voltage divider means, respectively, each said voltage divider means having a first terminal coupled to an output of said adjustable D.C. reference source and having a second, opposite terminal grounded, and wherein an output of each said voltage comparator is coupled to a control input of one said switch means.

13. A circuit for generating an adjustable ramp signal, comprising:
an adjustable D.C. reference voltage source having an output coupled to provide a desired adjustable first D.C. reference voltage;
a first means having an input coupled to receive said adjustable first D.C. reference voltage and having an output coupled to provide a predetermined ratio thereof;
an integrating means having an inverting input coupled to receive a positive or negative D.C. input step voltage for responsively coupling said inverting input to said adjustable first D.C. reference voltage or ground, respectively, having a non-inverting input coupled to said output of said first means for receiving said predetermined ratio of said adjustable first D.C. reference voltage and having an output coupled to provide said ramp signal in response to said D.C. input step voltage;
said integrating means being further coupled to receive said adjustable first D.C. reference voltage and to limit a maximum value of said ramp signal provided thereby to a value determined by said adjustable first D.C. reference voltage;
said integrating means having a series input resistor couled between an input terminal for receiving said input step voltage and said inverting input and having a feedback capacitor coupled between said output and said inverting input of said integrating means and having a predetermined number of further input resistors and switch means respectively, each further input resistor being coupled in parallel to said series input resistor via one said switch means; and
a detecting means coupled to detect predetermined magnitudes of an increasing ramp signal in a first succession and to apply responsively respective control signals to said switches to connect is sasid first succession said further resistors respectively to said series input resistor to obtain an incrementally increasing slope of said increasing ramp signal and said detecting means being coupled to detect said predetermined magnitudes of a decreasing ramp signal in a second succession, opposite to said first succession and to apply responsively respective control signals to said switches to disconnect in said second succession said further resistors respectively from said series input resistor to obtain an incrementally decreasing slope of said decreasing ramp signal.

14. A method of providing a ramp signal, comprising the steps of:
providing a first D.C. reference voltage;
providing a predetermined ratio of said first D.C. reference voltage;
providing an increasing or decreasing integrated D.C. ramp voltage respectively, in response to a D.C. input step signal having a selected integrating time constant corresponding to a selected slope of said ramp voltage;
limiting said D.C. ramp voltage to a maximum value determined by said first D.C. reference voltage;
detecting in succession predetermined magnitudes obtained by said increasing or decreasing D.C. ramp voltage; and
successively increasing or decreasing in predetermined increments the slope of said ramp voltage, respectively, in response to detected predetermined magnitudes obtained by said respectively increasing or decreasing ramp signal.

15. The method of claim 14 wherein said step of successively increasing or decreasing the slope of said ramp voltage, respectively, is provided by successively decreasing or increasing said selected integrating time constant, respectively in predetermined increments.

16. The method of claim 15 wherein said first D.C. reference voltage is adjustable.

* * * * *